United States Patent [19]

Marancik

[11] 4,447,946
[45] May 15, 1984

[54] METHOD OF FABRICATING MULTIFILAMENT INTERMETALLIC SUPERCONDUCTOR

[75] Inventor: William G. Marancik, Basking Ridge, N.J.

[73] Assignee: Airco, Inc., Montvale, N.J.

[21] Appl. No.: 282,832

[22] Filed: Jul. 13, 1981

Related U.S. Application Data

[63] Continuation of Ser. No. 74,186, Sep. 10, 1979, abandoned.

[51] Int. Cl.³ .............................................. H01L 39/24
[52] U.S. Cl. ..................................... 29/599; 148/129; 148/11.5 Q; 148/133; 174/128 S
[58] Field of Search ...................... 29/599, 527.7, 527.6, 29/527.5, 527.4, 527.2, 527.1; 174/126 S, 128 S; 148/11.5 F, 11.5 Q, 129, 133

[56] References Cited

U.S. PATENT DOCUMENTS

| | | | |
|---|---|---|---|
| 3,644,987 | 2/1972 | Scheffler et al. | 29/599 |
| 3,728,165 | 4/1973 | Howlett | 29/599 |
| 3,778,894 | 12/1973 | Kono et al. | 29/599 |
| 4,053,976 | 10/1977 | Scanlan et al. | 29/599 |

FOREIGN PATENT DOCUMENTS 53-102694  9/1978  Japan .............................. 174/128 S

*Primary Examiner*—Howard N. Goldberg
*Assistant Examiner*—V. K. Rising
*Attorney, Agent, or Firm*—Larry R. Cassett

[57] ABSTRACT

Nb wire and Sn plated Cu wire and/or Sn plated Cu foil strip are fabricated into a composite that is mechanically worked to form a multifilament superconductor precursor that does not require intermediate anneals and that has required amounts of Sn distributed throughout its cross section for efficient reaction with the Nb filaments.

6 Claims, 3 Drawing Figures

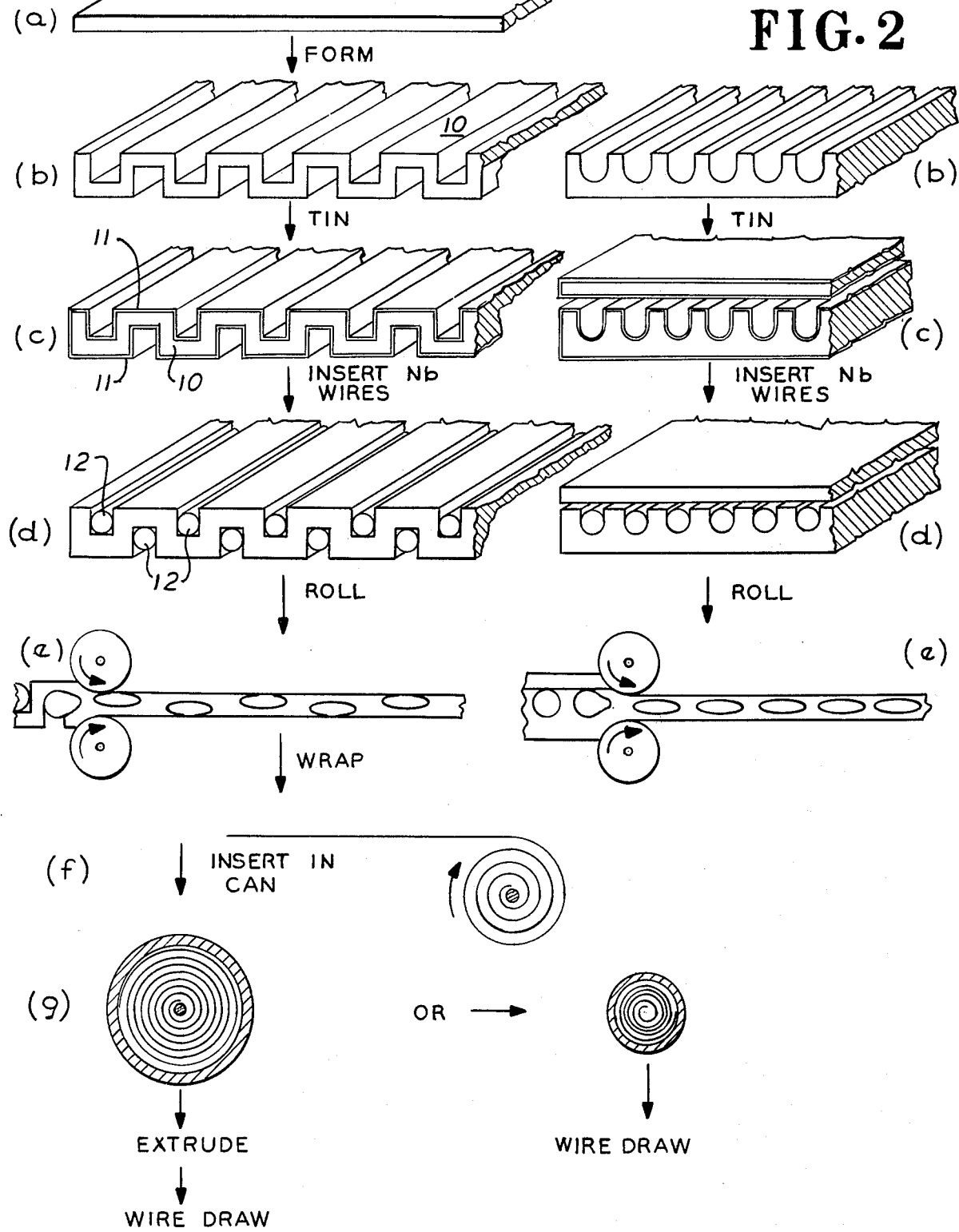

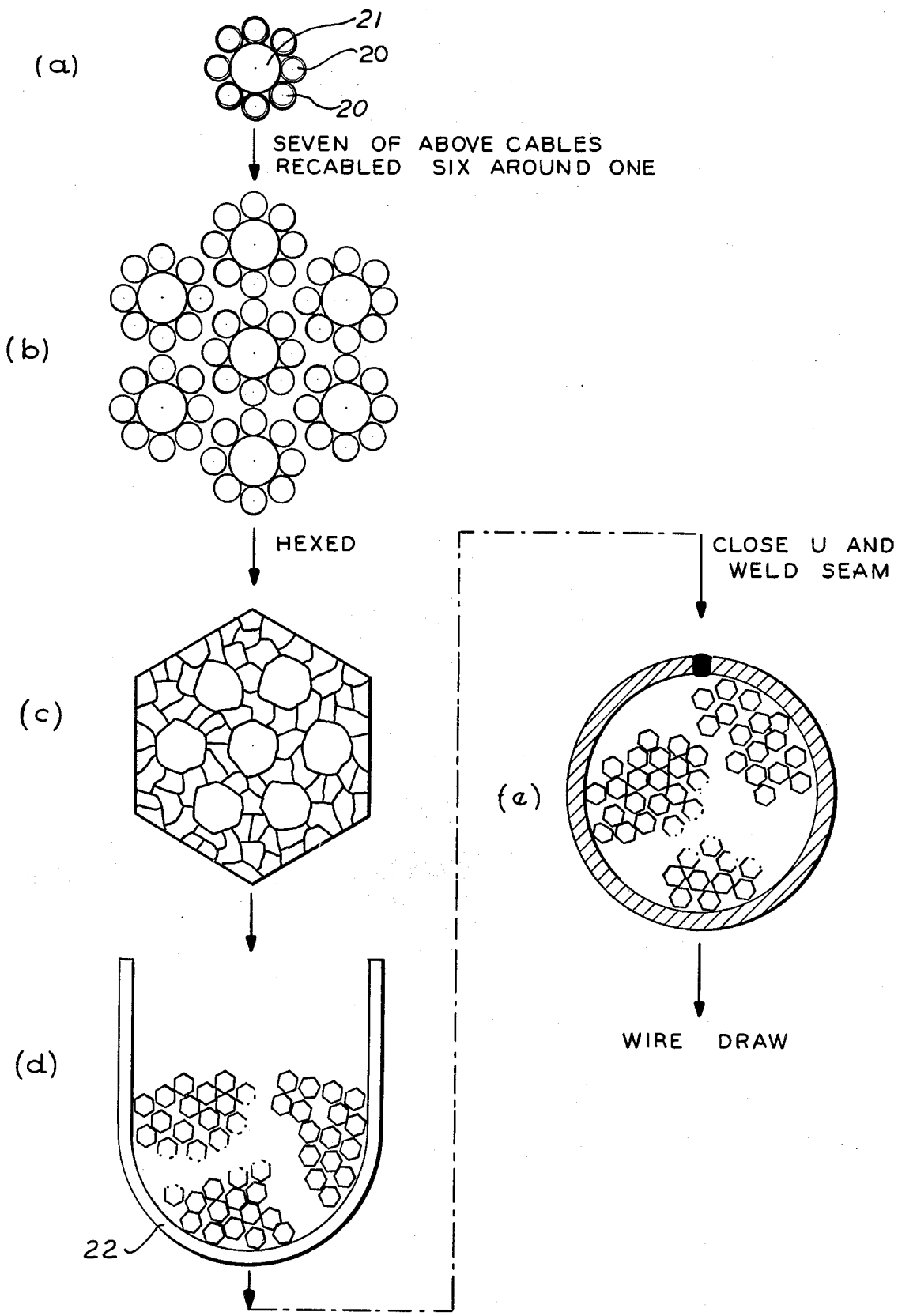

METHOD OF FABRICATING MULTIFILAMENT INTERMETALLIC SUPERCONDUCTOR

This application is a continuation of application Ser. No. 74,186, filed Sept. 10, 1979, now abandoned.

FIELD OF THE INVENTION

This invention relates to an improved method of fabricating multifilamentary $A_3B$ intermetallic superconductors of the A-15 crystal structure. More particularly, this invention provides an improved method of fabricating superconducting wire containing a plurality of fine filaments of $Nb_3Sn$ from available "off the shelf" starting materials while avoiding the need for choosing between the costly and time consuming intermediate annealing required in the prior art "bronze process" or the equally unpalatable, difficult and time consuming external tin diffusion suggested by the prior art as a way of avoiding the bronze work hardening.

BACKGROUND OF THE INVENTION

The field of superconductivity has been expanding rapidly in recent years due in large part to the discovery of materials which retain the superconductive property at usefully high current levels, temperatures, and external magnetic fields. Among the more useful materials are $Nb_3Sn$ and $V_3Ga$, both intermetallic compounds having the so-called A-15 crystal structure. While these materials can be made in useful shapes and quantities, they are nevertheless expensive to produce, due to the fact that they are metastable phases which cannot be made by simple chemical processes, and because they are extremely brittle and therefore cannot, once made, be mechanically deformed to any great extent.

The method now most widely used to make $Nb_3Sn$ and $V_3Ga$ is the "bronze process", whereby Nb or V is brought into contact with a bronze made up of copper and Sn or Ga, respectively. The composite thus formed is mechanically worked to its desired shape and subjected to a long-term, high temperature heat-treatment, whereby the Sn or Ga in the bronze diffuses through the Cu of the bronze to form $Nb_3Sn$ or $V_3Ga$ at the interface(s) between the Nb or V and the bronze.

It being well known in the art that superconductors perform better when the superconductive material is divided between a number of extremely fine wires embedded in a metallic matrix, the aim of the art has been to develop methods of making such multifilamentary conductors. The bronze process described above has been proven capable of modification to suit this goal; an example of a workable process is discussed in U.S. Pat. No. 3,918,998, assigned to the assignee of the present invention. A typical process for the manufacture of a multifilamentary $Nb_3Sn$ conductor begins with the drilling of a plurality of holes in a Cu/Sn bronze billet for the insertion of Nb rods. This billet is then extruded to a rod, which is then drawn down to fine wire. In some cases it is desirable that even more filaments be produced; this can be done by cutting the rod into a large number of equal lengths at some intermediate size, inserting these into an extrusion can, extruding this assembly and drawing the result to fine wire. The rod may be drawn through a hex-shaped die prior to cutting; if the rod is thus hexed, the lengths pack together in the extrusion can with less wasted space.

In some cases it is desirable that there be provided a quantity of pure copper of good electrical conductivity. This may be done by lining a copper extrusion can with a layer of a metal which is impermeable to tin, during high temperature heat-treatment, so that the tin does not diffuse into the copper and lower its conductivity; tantalum is the metal most commonly used. See, e.g., U.S. Pat. No. 3,996,661. A quantity of a good electrical conductor in close proximity to the superconductive material is useful as an alternate current path or shunt in situations where it is likely that some fraction of the superconductive filaments will return to the normally-conducting state, which can happen, for example, in a rapidly-varying magnetic field.

The present state of the art, as outlined above, uses the bronze process to achieve multifilamentary intermetallic superconductors which are "stabilized" by the provision of a quantity of a good electrical conductor. However, the bronze process is not without its difficulties. Chief among these is the fact that in order to improve the maximum current density carried by the superconductor, it is desirable to increase the amount of superconductive material per unit of cross-sectional area of the whole conductor. To do this it is clear that a sufficiency of tin must be provided, which could be done simply by increasing the percentage of tin in the bronze. Unfortunately, the production of a large number of extremely fine filaments demands a large number of metal-working steps—chiefly drawing—during which the bronze work hardens very quickly, necessitating frequent time-consuming and costly annealing operations. In fact, the practical maximum volume percentage of tin in the bronze which permits working is 15%; and even at this relatively low value, annealing is required rougly every two to six drawing operations, at a rate of 15–20% area reduction per pass.

A solution to this problem is suggested in U.S. Pat. No. 3,838,503. The approach is to simply draw Nb or V wires in a pure copper matrix to the final size desired, and only then adding Sn or Ga to the external surface of the wire, typically by electroplating. Upon heat treatment, the Sn or Ga is diffused through the copper and forms the desired intermetallic compound on the surface of the Nb or V filaments.

This method is not without utility, but is severely limited in that only a very thin layer of Sn or Ga can be applied by conventional dipping, electroplating or vapor deposition processes, thus limiting the size of the conductor which can be produced. An improvement on this method, which has been suggested in U.S. Pat. No. 3,829,963, is to perform a number of such dipping or plating steps and following these by homogenizing steps, thus gradually building up the amount of Sn or Ga in the bronze. However, this process is rather complicated, and is limited as to the size of the conductor which can be effectively permeated with Sn or Ga.

Another alternative is described in U.S. Pat. No. 3,954,572. If it is desired to manufacture $Nb_3Sn$, for example, a number of Nb rods will be inserted into a Cu matrix. This assembly is then worked to a fine wire, and a Cu/Sn bronze is electroplated on the surface of the wire. Upon heat-treatment, the Sn diffuses towards the Nb to form $Nb_3Sn$. This method is, however, limited by the amount of tin which can be readily applied. A similar method is discussed in Erwens, *Fabrication and Properties of Multifilament $Nb_3Sn$ Conductors*, Z. Metallk, 66 (12):711–14 (December 1975); it too is limited in that the maximum thickness of tin which can be applied is approximately 30 μm.

Still another approach to the problem in the past has been to fabricate a precursor with a plurality of Nb tubes embedded in a Cu matrix. The inside of each tube is filled with CuSn bronze or pure Sn or both. After working the precursor to its final size a reaction heat treatment converts the interior wall of each Nb tube to Nb$_3$Sn. The problem in this method is the difficulty and/or expense of obtaining the Nb tubes and of maintaining their integrity during the extrusion and wire drawing steps.

Given the state of the art as outlined above, it will be apparent that there exists a distinct need for a method of making a multifilamentary superconductor of the Nb$_3$Sn type from readily available materials that does not involve the mechanical working of bronze and that does not require the diffusion of externally applied Sn through the conductor to the embedded filaments.

OBJECTS OF THE INVENTION

An object of this invention is to provide a simplified method of fabricating a multifilament Nb$_3$Sn superconductor from readily available stocks of copper in strip or wire form, tin and small diameter Nb wire.

Another object of the invention is to provide a simplified method of fabricating a multifilament Nb$_3$Sn superconductor without the need for intermediate annealing heat treatments.

Another object of the invention is to provide a simplified method of fabricating a multifilament Nb$_3$Sn superconductor that has a high density of Nb$_3$Sn filaments and does not require diffusion of Sn into the conductor from the outside.

Still another object of the invention is to provide a simplified method of fabricating a multifilament Nb$_3$Sn superconductor in which the preselected amount of Sn is distributed throughout the precursor to thereby reduce the reaction heat treatment time and improve the efficiency of the reaction heat treatment in conversion of the surfaces of the Nb filaments to Nb$_3$Sn.

BRIEF SUMMARY OF THE INVENTION

In accordance with the invention, Nb (niobium) in wire form and Sn (tin) coated Cu (copper) in the form of wire or foil strip are combined to make a superconductor precursor having a plurality of Nb filaments dispersed in a composite matrix of elemental Cu and elemental Sn that can be extruded and/or wire drawn to the desired final diameter with the desired number of Nb filaments without intermediate annealing after which it may be heat treated to react the Nb and Sn to form filaments of Nb$_3$Sn. The Sn is included in the precursor in carefully preselected amounts in very thin layers distributed throughout the precursor. In this way, the Sn can be proportionately retained through the extrusion and wire drawing steps and is available in the proximity of the Nb filaments to react with the Nb filaments to form Nb$_3$Sn filaments by diffusion heat treatment. No difficult external diffusion step is required. Typically the Sn is supplied in an amount that will leave some of the Nb unreacted. The Sn may be pure Sn or a high Sn alloy, i.e. an alloy of more than 90% Sn and Cu.

DESCRIPTION OF THE DRAWINGS

In the drawings:

FIG. 1 is a schematic showing of the successive steps of forming the unreacted precursor billet for extrusion and/or drawing to wire in one form of the invention.

FIG. 2 illustrates an alternative form of corrugated strip that may be used in place of that shown at (b) to (e) in FIG. 1.

FIG. 3 illustrates schematically another embodiment of the invention utilizing only simple wire and strip as starting materials.

DETAILED DESCRIPTION

Illustrative of the invention is the embodiment schematically illustrated in FIG. 1. In this example the starting materials are simple thin gauge Cu strip, a Sn plating bath and Nb wire. In this example, the design criteria selected is 2.5 volumes of combined Cu-Sn to 1 volume of Nb. To achieve this ratio, Cu strip 10, typically 0.006 inch (0.015 cm) thick and 18 inches (45.7 cm) wide, shown at (a), is deformed in a conventional crimping machine to produce the corrugated configuration shown at (b). The inside dimensions of the corrugations are typically 0.012 inch (0.030 cm) wide and 0.012 inch deep. The corrugated Cu strip is next Sn coated by any known coating method, but preferably by electroplating on all surfaces as illustrated in (c). The thickness of the Sn coating 11 is carefully controlled to provide the desired Sn content in relation to the other elements of the composite. In this example, the Sn is provided in an amount to be 15% by volume (11.5% by weight) of the combined Sn and Cu. For such proportion the thickness of the electroplated Sn coating should be 0.000483 inch (0.0012 cm). Next 18 inch lengths of 0.010 inch (0.025 cm) diameter Nb wire 12 are inserted in each 0.012 inch square corrugation as shown at (d). The Sn plated corrugated Cu strip, with Nb wires inserted is then rolled to fill the voids and lock the Nb wires in place as shown at (e). Typically the 0.018 inch (0.046 cm) thick composite is rolled to a thickness of 0.009 inch (0.023 cm). In this step the 0.010 inch diameter Nb wires are flattened to a roughly 0.005×0.020 inch (0.013×0.051 cm) oval cross sectional configuration and there is one such Nb wire in each 0.036 inch (0.092 cm) (approximately 27 filaments per inch) of the 0.009 inch thick rolled composite.

A predetermined length of the composite Cu-Sn-Nb strip material described above may then be wrapped into a spiral configuration that can thereafter be extruded and/or wire drawn to produce the final form of unreacted conductor. For example, a conductor having 145,583 filaments may be made by spiral wrapping 437 feet (132 m) of the composite strip on a core of 0.25 inch (0.64 cm) copper rod to form an Archimedean spiral having an outside diameter of 7.75 inches (19.7 cm). The spiral wrapped strip is inserted in a Cu can to form an 8 inch (20.3 cm) diameter extrusion billet. This is followed by conventional extrusion and wire drawing steps to produce a conductor of the desired final diameter which may be of the order of 0.125 inch (0.32 cm).

If it is desired to produce a conductor with a lesser number of filaments a shorter length of the composite strip can be spiral wrapped to make a smaller diameter billet which can be elongated solely by wire drawing. For example, 131 feet (40 m) of the composite strip can be spiral wrapped and inserted in a 3 inch (7.62 cm) diameter copper can to produce a billet having 42,411 filaments. This can be drawn to wire directly. Since the strip contains no bronze or other work hardenable alloys, no intermediate annealing is required during the conversion of the billet to wire.

Reaction heat treatment of the finished wire to convert the Nb filaments to Nb$_3$Sn by diffusion of the distributed Sn to the surface of the Nb filaments is carried out as is well known in the art. Typically this involves heating the wire to 550° C. to 750° C. in an inert atmosphere for sufficient time to allow diffusion equilibrium conditions to be established at which time there is maximum conversion of Nb and Sn to the intermetallic reaction product $Nb_3Sn$. Alternatively, the wire can be subjected to an initial diffusion heat treatment of about 450° C. for a few hours to homogenize the Sn and Cu after which the temperature can be raised to the 550° C.–750° C. range for reaction of the Nb with the Sn. In the present invention maximum yield is obtained in minimum time because the Sn is present in preselected stoichiometric amount uniformly distributed throughout the conductor and in the immediate vicinity of each Nb filament.

Obviously the corrugated and tin coated copper strip of the foregoing example can take a variety of forms without deviating from the spirit of this species of the invention. For example, FIG. 2 illustrates a modification in which a strip of Cu is grooved on one side to receive the Nb wires and the wires are locked in place by another strip of Cu rolled onto the first strip. FIG. 2, parts (b), (c), (d) and (e) correspond to the similarly marked parts of FIG. 1. Many other modifications are, of course, possible.

Another embodiment of the invention is schematically illustrated in FIG. 3. In this embodiment the starting materials are Sn plated Cu wire, Nb wire and Cu strip. As an example, a design criteria may be selected that specifies a Cu+Sn to Nb ratio of 3. In this example, 8 Cu wires 20 of 0.0055 inch (0.014 cm) diameter and Sn plated to have a Sn coating of 0.00052 inch (0.0013 cm) thickness are cabled around a Nb wire 21 of 0.010 inch (0.025 cm) diameter as a core to form a composite primary cable illustrated at (a). This is compacted on the cabling machine to minimize voids. Seven of these primary cables are combined to form a secondary cable illustrated at (b) which is also compacted to eliminate voids and to give the secondary cable a hexagonal configuration as shown at (c). The hexagonal size of the secondary cable will be 0.050 inch (0.13 cm) flat to flat. 241 of these secondary cables of hexagonal cross section, each 10 feet long, are assembled and placed in a U shaped strip 22 of similar length made of 0.060 inch (0.15 cm) thick Cu as shown at (d). The U is closed and the longitudinal seam welded as shown at (e) to form the superconductor precursor having a diameter of approximately 1 inch (2.54 cm) which may then be wire drawn and reaction heat treated as before. Obviously if more filaments are required than are provided by the foregoing example, the number of hexagonal secondary cables and the tube size is increased. For example, 1057 hexagonally shaped secondary cables can be packed in a U of 0.125 inch (0.32 cm) thick copper strip to form a 2 inch diameter tube having 7,399 Nb filaments. Because the hexagonally shaped secondary cables are very small (0.050 inch flat to flat) they can be inconvenient to handle. A solution to this problem is to bundle a number of the hexed secondary cables together and heat them enough to fuse the Sn and, in effect, solder them together into a rigid rod which can be slid into a Cu tube. This also avoids the tube forming and welding step.

While in the foregoing example there is described a primary cable having a Nb core wire surrounded by Sn plated Cu wires and a secondary cable of a plurality of such primary cables, it will be readily apparent to those skilled in the art that the Nb wires and Sn plated Cu wires may be proportioned and arranged in the primary cable in any combination to meet the design criteria and the secondary cable may be made from primary cables that are all alike or by combining two or more different species of primary cables.

A significant departure of this invention from the prior art resides in starting with small diameter Nb wire (instead of rod) as the superconductor precursor Nb filament source. Nb wire is diameters down to about 0.010 inch (0.025 cm) is commercially available and while it is somewhat more expensive than rod, most of the mechanical work has already been put into it and when received from the supplier it is fully annealed. This facilitates the remaining wire drawing operations. To achieve the objectives of the invention, the Sn plated Cu used in the composite must be commensurate in size with the Nb wire. It has been found that the Cu strip or wire which is Sn plated and formed into a composite with the Nb wire, should have one dimension not exceeding the diameter of the Nb wire with which it is combined. This assures the proper distribution of Cu and Sn in the cross section of the composite to maintain the integrity of the composite during the extrusion and/or drawing and insures complete and efficient conversion of the Nb filaments to filaments of $Nb_3Sn$.

The benefits of the invention are best realized if the Nb wire used as starting material does not exceed about 0.050 inch (0.13 cm) diameter or equivalent for other cross sectional shape.

In accordance with the present invention, the designer of the conductor has great freedom in selecting the ratio of Nb to combined Cu+Sn and the ratio of Cu to Sn because each element is supplied separately in the composite. Thus the volumetric ratio of Nb is combined Cu+Sn may typically be in the range of from 1 part Nb to 1 part Cu+Sn to 1 part Nb to 4 parts Cu+Sn. The Sn should preferably be limited to a maximum thickness as adhered coating on the copper of 0.001 inch (0.0025 cm) and may typically be from 10% to 25% by weight of the Cu to which it is applied. If the Cu wires are made small, the surface area to volume ratio is large, allowing a large Sn content to be incorporated in the billet.

Common to all of the embodiments described and many other variations that will be readily apparent to those skilled in the art is the fact that there has been provided a viable method for fabricating multifilament $Nb_3Sn$ superconducting wire from readily available "off the shelf" forms of Cu, Sn and Nb. The novel fabrication method eliminates the need in the prior art "bronze process" to prepare specially cast bronzes while still giving the fabricator complete freedom in selecting the Sn to Cu ratio. The novel fabrication method also eliminates the costly and difficult need to drill long, small diameter holes in Cu or CuSn bronze billets to accommodate the Nb rods for proper distribution in the product as it is now prepared by prior art processes. The novel fabrication method provides Sn distributed in the immediate vicinity of the Nb filaments throughout the precursor without incurring the difficulties inherent when the Sn is present combined with the Cu as bronze. The novel fabrication method also makes unnecessary the difficult and costly step of diffusing Sn into the conductor from outside as is the present state of the art when bronze is not used. Also since the Sn is distributed throughout the conductor the diffusion and reaction time is significantly less than that required by the prior art.

In the specific embodiments described herein, the final product consists of distributed $Nb_3Sn$ filaments in a CuSn bronze matrix. While the Sn content of this bronze can be quite low if less than stoichiometric amounts of Sn are provided and the reaction with Nb is carried to completion, it is recognized in the art that the residual Sn in the Cu matrix degrades the electrical conductivity of the Cu. For this reason, high conductivity Cu is added to the conductor as an internal element of the composite conductor or as a sheath surrounding it. The present invention is well adapted to the same additions. Pure Cu can be provided as a core of sheath in the spirally wrapped specie and as a selected portion of the secondary cables in the cabled wire specie. The pure Cu components can be protected from Sn diffusion by the usual barrier of Ta or other heavy metal as is now well known in the art.

While the invention has been described with respect to the fabrication of multifilament $Nb_3Sn$ it is anticipated that is is useful also in the manufacture of any of the intermetallics having the composition $A_3B$ and having the A-15 crystal structure and known to have superconductive properties.

I claim:

1. A method of making a superconducting wire of the type in which a predetermined number of fine filaments of intermetallic superconductor having the composition $A_3B$ and the A-15 crystal structure are embedded in a matrix of normal conductor which comprises distributing wires of A having a nominal diameter not greater than 0.050 inch in a body consisting of Cu and interspersed B material, the B material being provided as a coating on Cu stock having a cross sectional dimension in one direction not greater than the diameter of the wires of A, mechanically working the composite to reduce its cross section to the desired final wire diameter with concomitant elongation, and heating treating the conductor to cause the dispersed B material to diffuse into the Cu and to migrate to and react with the A material filaments to form filaments of $A_3B$.

2. A method according to claim 1 in which the A material is Nb, and B material is Sn and the Cu stock is foil strip to which the Sn is applied by plating.

3. A method according to claim 1 in which the A material is Nb, the B material is Sn and the Cu stock is wire to which the Sn is applied by plating.

4. A method of fabricating a multifilament $Nb_3Sn$ superconducting wire having a predetermined number of $Nb_3Sn$ filaments distributed in a matrix of normally conducting metal which comprises (a) assembling a composite of said predetermined number of Nb wires having a nominal diameter not greater than 0.050 inch, Cu and Sn, the Sn being in the form of an adhered coating on the Cu, the Cu being in a form having one cross sectional dimension not exceeding the diameter of the Nb wires and the Sn coating being of a thickness to provide Sn in an amount of 10% to 25% of the weight of Cu and the Cu+Sn being in an amount to provide from 1 to 4 times the Nb content by volume, (b) mechanically working said composite to reduce its cross section to the desired final wire diameter with concomitant elongation, and (c) heat treating the conductor to cause the dispersed Sn to diffuse into the Cu and to migrate to and react with the Nb filaments to form filaments of $Nb_3Sn$.

5. A method for the fabrication of a multifilament $Nb_3Sn$ superconducting wire which comprises
   (a) crimping Cu foil strip having a thickness no greater than the diameter of the Nb wires referred to below to form corrugations therein,
   (b) Sn plating the corrugated foil strip,
   (c) inserting Nb wires having a nominal diameter not greater than 0.050 inch into the corrugations of the Sn plated corrugated foil strip,
   (d) rolling the Sn plated corrugated Cu strip containing the Nb wires into a spiral,
   (e) mechanically working the said spiral to reduce its diameter to that of the desired superconducting wire and to concomitantly consolidate and elongate it, and
   (f) heat treating the product of step (e) to cause the Sn to diffuse through the structure and form $Nb_3Sn$ at the surface of each Nb filament.

6. A method for the fabrication of a multifilament $Nb_3Sn$ superconducting wire which comprises
   (a) cabling together Nb wires having a nominal diameter not greater than 0.050 inch and Sn plated Cu wires having a cross-sectional dimension in one direction not greater than the diameter of the Nb wires to provide a volumetric ratio of $(Sn+Cu)/Nb$ in the range from 1 to 4,
   (b) compacting said cable to reduce the voids therein and to form the external surface to adapt it to combine with other like cables to form a bundle of such cables,
   (c) combining said cable with a plurality of like cables to form a bundle of such cables,
   (d) mechanically working said bundle of cables to reduce its cross section to that of the desired superconducting wire and to concomitantly consolidate and elongate it, and
   (e) heat treating the product of step (d) to cause the Sn to diffuse through the structure and form $Nb_3Sn$ at the surface of each Nb filament.

* * * * *